(12) United States Patent
Pai et al.

(10) Patent No.: US 9,899,249 B2
(45) Date of Patent: Feb. 20, 2018

(54) FABRICATION METHOD OF CORELESS PACKAGING SUBSTRATE

(71) Applicant: Siliconware Precision Industries Co., Ltd., Taichung (TW)

(72) Inventors: Yu-Cheng Pai, Taichung (TW); Chun-Hsien Lin, Taichung (TW); Shih-Chao Chiu, Taichung (TW); Wei-Chung Hsiao, Taichung (TW); Ming-Chen Sun, Taichung (TW); Tzu-Chieh Shen, Taichung (TW); Chia-Cheng Chen, Taichung (TW)

(73) Assignee: Siliconware Precision Industries Co., Ltd., Taichung (TW)

(*) Notice: Subject to any disclaimer, the term of this patent is extended or adjusted under 35 U.S.C. 154(b) by 0 days.

(21) Appl. No.: 15/334,569

(22) Filed: Oct. 26, 2016

(65) Prior Publication Data

US 2017/0047240 A1 Feb. 16, 2017

Related U.S. Application Data

(62) Division of application No. 14/583,317, filed on Dec. 26, 2014, now Pat. No. 9,510,463.

(30) Foreign Application Priority Data

Jul. 17, 2014 (TW) .............................. 103124499 A (51) Int. Cl.
| | |
|---|---|
| *H01L 21/683* | (2006.01) |
| *H05K 3/40* | (2006.01) |
| *H01L 23/498* | (2006.01) |
| *H01L 21/48* | (2006.01) |

(Continued)

(52) U.S. Cl.
CPC ........ *H01L 21/6835* (2013.01); *H01L 21/486* (2013.01); *H01L 21/4857* (2013.01);
(Continued)

(58) Field of Classification Search
CPC ............. H01L 21/6835; H01L 21/5857; H01L 23/486; H01L 21/486; H01L 23/49822; H01L 23/49827
See application file for complete search history.

(56) References Cited

U.S. PATENT DOCUMENTS

| | | | |
|---|---|---|---|
| 2008/0121874 A1* | 5/2008 | Moriya | H01L 21/56 257/40 |
| 2008/0272501 A1* | 11/2008 | Hu | H01L 23/498 257/782 |

(Continued)

*Primary Examiner* — Nathan W Ha
(74) *Attorney, Agent, or Firm* — Mintz Levin Cohn Ferris Glovsky and Popeo, P.C.; Peter F. Corless; Steven M. Jensen (57) ABSTRACT

A coreless packaging substrate is provided, which includes: a dielectric layer having opposite first and second surfaces; a first circuit layer embedded in the dielectric layer and exposed from the first surface of the dielectric layer, wherein the first circuit layer has a plurality of first conductive pads; a plurality of protruding elements formed on the first conductive pads, respectively, wherein each of the protruding elements has contact surfaces to be encapsulated by an external conductive element; a second circuit layer formed on the second surface of the dielectric layer; and a plurality of conductive vias formed in the dielectric layer for electrically connecting the first circuit layer and the second circuit layer. The present invention strengthens the bonding between the first conductive pads and the conductive elements due to a large contact area between the protruding elements and the conductive elements.

10 Claims, 9 Drawing Sheets

(51) Int. Cl.
  *H05K 3/46*       (2006.01)
  *H05K 3/20*       (2006.01)
  *H01L 23/00*      (2006.01)

(52) U.S. Cl.
  CPC ...... *H01L 23/498* (2013.01); *H01L 23/49811* (2013.01); *H01L 23/49822* (2013.01); *H01L 23/49827* (2013.01); *H01L 23/49838* (2013.01); *H05K 3/4007* (2013.01); *H01L 24/17* (2013.01); *H01L 2221/68345* (2013.01); *H01L 2221/68359* (2013.01); *H01L 2221/68381* (2013.01); *H01L 2224/16225* (2013.01); *H01L 2224/16227* (2013.01); *H01L 2224/16238* (2013.01); *H05K 3/20* (2013.01); *H05K 3/4682* (2013.01); *H05K 2201/0367* (2013.01); *H05K 2201/09563* (2013.01); *H05K 2201/10674* (2013.01)

(56) References Cited

U.S. PATENT DOCUMENTS

| | | | |
|---|---|---|---|
| 2009/0008765 A1* | 1/2009 | Yamano | H01L 21/565 257/690 |
| 2009/0020322 A1* | 1/2009 | Hsu | H01L 23/498 174/257 |
| 2009/0045524 A1 | 2/2009 | Mohammed et al. | |
| 2009/0315170 A1 | 12/2009 | Shim et al. | |
| 2010/0244280 A1* | 9/2010 | Shimizu | H01L 21/4857 257/784 |
| 2011/0097851 A1 | 4/2011 | Hsu | |
| 2011/0104858 A1 | 5/2011 | Katagiri et al. | |
| 2011/0104886 A1 | 5/2011 | OI et al. | |
| 2012/0007232 A1 | 1/2012 | Haba | |
| 2012/0181688 A1* | 7/2012 | Hsu | H01L 23/498 257/737 |
| 2013/0249076 A1* | 9/2013 | Lee | H01L 23/498 257/737 |
| 2014/0319696 A1 | 10/2014 | Yu et al. | |
| 2014/0327135 A1* | 11/2014 | Lee | H01L 23/498 257/737 |
| 2015/0061143 A1* | 3/2015 | Kim | H01L 21/768 257/773 |
| 2015/0287671 A1 | 10/2015 | Chen et al. | |
| 2015/0348929 A1* | 12/2015 | Hsiao | H01L 24/17 257/737 |
| 2016/0163626 A1* | 6/2016 | Chou | H01L 23/49822 174/251 |

* cited by examiner

FABRICATION METHOD OF CORELESS PACKAGING SUBSTRATE

CROSS-REFERENCE TO RELATED APPLICATION(S)

This application is a divisional of copending application U.S. Ser. No. 14/583,317, filed on Dec. 26, 2014, which claims under 35 U.S.C. § 119(a) the benefit of Taiwanese Application No. 103124499 filed Jul. 17, 2014, the entire contents of which are incorporated herein by reference.

BACKGROUND OF THE INVENTION

1. Field of the Invention

The present invention relates to coreless packaging substrates and fabrication methods thereof, and more particularly, to a coreless packaging substrate having protruding elements formed on conductive pads of a circuit layer and a fabrication method thereof.

2. Description of Related Art

Along with the rapid development of electronic industries, electronic products are developed toward the trend of multi-function and high electrical performance. To meet the high integration and miniaturization requirements of semiconductor packages, the conductive pads of a coreless packaging substrate are reduced in size. Accordingly, when a chip is disposed on the conductive pads through a plurality of bumps, there is a reduced contact area between the conductive pads and the corresponding bumps, thereby easily resulting in a poor bonding therebetween and adversely affecting the product reliability.

Figure 1A:
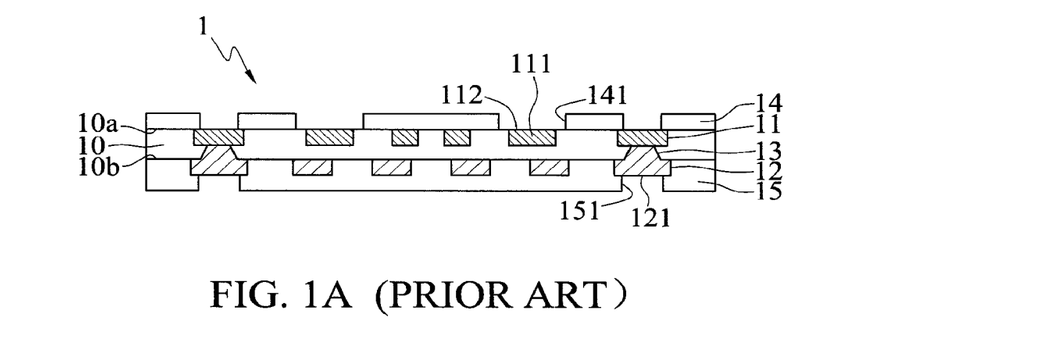
FIG. 1A is a schematic cross-sectional view of a conventional coreless packaging substrate.
Figure 1B:
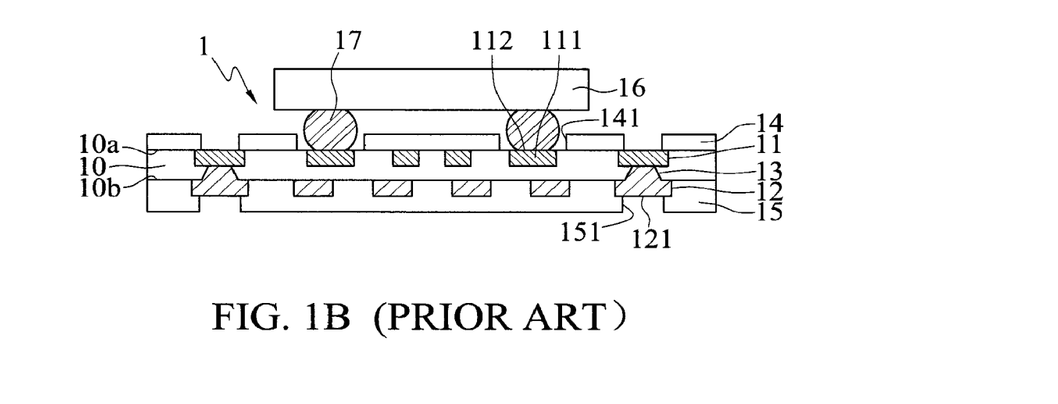
FIG. 1B is a schematic cross-sectional view of a semiconductor package having a chip disposed on the coreless packaging substrate of FIG. 1A through a plurality of bumps.

FIG. 1A is a schematic cross-sectional view of a conventional coreless packaging substrate 1 and FIG. 1B is a schematic cross-sectional view of a semiconductor package having a chip 16 disposed on the coreless packaging substrate 1 through a plurality of bumps 17.

Referring to FIGS. 1A and 1B, the coreless packaging substrate 1 has a dielectric layer 10 having opposite first and second surfaces 10a, 10b, a first circuit layer 11 formed on the first surface 10a of the dielectric layer 10 and having a plurality of first conductive pads 111, a second circuit layer 12 formed on the second surface 10b of the dielectric layer 10 and having a plurality of second conductive pads 121, a plurality of conductive vias 13 formed in the dielectric layer 10 for electrically connecting the first circuit layer 11 and the second circuit layer 12, a first insulating layer 14 formed on the first surface 10a of the dielectric layer 10 and having a plurality of first openings 141 exposing contact surfaces 112 of the first conductive pads 111, and a second insulating layer 15 formed on the second surface 10b of the dielectric layer 10 and having a plurality of second openings 151 exposing the second conductive pads 121.

However, since the contact surfaces 112 of the first conductive pads 111 are planar, there will be a small contact area between the first conductive pads 111 and the bumps 17, thereby resulting in a poor bonding between the first conductive pads 111 and the bumps 17 and reducing the product reliability.

Therefore, there is a need to provide a coreless packaging substrate and a fabrication method thereof so as to overcome the above-described drawbacks.

SUMMARY OF THE INVENTION

In view of the above-described drawbacks, the present invention provides a coreless packaging substrate, which comprises: a dielectric layer having opposite first and second surfaces; a first circuit layer embedded in the dielectric layer and exposed from the first surface of the dielectric layer, wherein the first circuit layer has a plurality of first conductive pads; a plurality of protruding elements formed on the first conductive pads, respectively, wherein each of the protruding elements has contact surfaces to be encapsulated by an external conductive element; a second circuit layer formed on the second surface of the dielectric layer; and a plurality of conductive vias formed in the dielectric layer for electrically connecting the first circuit layer and the second circuit layer.

The contact surfaces of each of the protruding elements can comprise upper and side surfaces of the protruding element. Each of the protruding elements can have a width less than or equal to that of the corresponding first conductive pad. Each of the protruding elements and the corresponding first conductive pad can be made of a same material or integrally formed. Each of the protruding elements can be a conductive post or a bonding pad, and the conductive element can be a bump.

The second circuit layer can have a plurality of second conductive pads and the conductive vias can be formed between the first circuit layer and the second conductive pads.

The substrate can further comprise a conductive layer formed on the contact surfaces of the protruding elements and portions of the first conductive pads. The substrate can further comprise a conductive layer formed between the protruding elements and the first conductive pads.

The substrate can further comprise an insulating layer formed on the second surface of the dielectric layer and the second circuit layer, wherein the insulating layer has a plurality of openings for exposing second conductive pads of the second circuit layer.

The present invention further provides a method for fabricating a coreless packaging substrate, which comprises the steps of: forming a first resist layer on a carrier, wherein the first resist layer has a plurality of first openings; forming a plurality of protruding elements in the first openings; forming a first circuit layer on the first resist layer, wherein the first circuit layer has a plurality of first conductive pads correspondingly formed on the protruding elements; forming a dielectric layer on the first resist layer so as to embed the first circuit layer in the dielectric layer, wherein the dielectric layer has a first surface bonded to the first resist layer and a second surface opposite to the first surface; forming a plurality of conductive vias in the dielectric layer and forming a second circuit layer on the second surface of the dielectric layer, wherein the first circuit layer and the second circuit layer are electrically connected through the conductive vias; and removing the first resist layer so as to expose contact surfaces of the protruding elements.

The dielectric layer can have a plurality of second openings, and the second openings are filled with a conductive material so as to form the conductive vias.

The method can further comprise forming a release layer on top and/or bottom surfaces of the carrier so as to allow the first resist layer to be formed on the release layer and portions of the release layer to be exposed from the first openings of the first resist layer.

The method can further comprise forming a conductive layer on the first resist layer, walls of the first openings and the portions of the release layer exposed from the first openings so as to allow the first circuit layer to be formed on the conductive layer and the protruding elements to be formed on the conductive layer in the first openings.

The method can further comprise: forming a second resist layer on the first circuit layer and the first conductive pads; removing portions of the conductive layer according to the second resist layer so as to expose portions of the first resist layer; and removing the second resist layer to expose the first circuit layer and the first conductive pads.

The method can further comprise forming an insulating layer on the second circuit layer, wherein the insulating layer has a plurality of third openings exposing the second conductive pads; and removing the release layer so as to remove the carrier.

The method can further comprise sequentially forming a release layer and a first conductive layer on top and/or bottom surfaces of the carrier so as to allow the first resist layer to be formed on the first conductive layer and portions of the first conductive layer to be exposed from the first openings of the first resist layer.

The method can further comprise forming a second conductive layer on the first resist layer and the protruding elements so as to allow the first circuit layer and the first conductive pads to be formed on the second conductive layer.

The method can further comprise: removing the release layer to remove the carrier; removing the first conductive layer and the first resist layer so as to expose the contact surfaces of the protruding elements; forming a second resist layer on the protruding elements; removing portions of the second conductive layer according to the second resist layer so as to expose portions of the dielectric layer; and removing the second resist layer to expose the contact surfaces of the protruding elements.

According to the present invention, a plurality of protruding elements are formed on the first conductive pads. The protruding elements can be encapsulated by external conductive elements such as bumps and a semiconductor component such as a chip can further be disposed on the protruding elements through the conductive elements. Since a large contact area (for example, including upper and side surfaces of the protruding elements) is formed between the protruding elements and the conductive elements, the present invention strengthens the bonding between the first conductive pads and the conductive elements, thereby increasing the product reliability.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

Figure 2A:
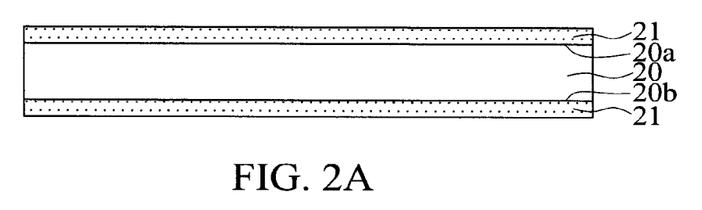
FIGS. 2A to 2L are schematic cross-sectional views showing a coreless packaging substrate and a fabrication method thereof according to a first embodiment of the present invention.
Figure 2B:
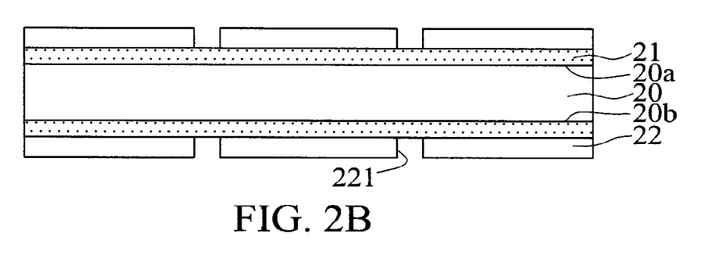
Figure 2C:
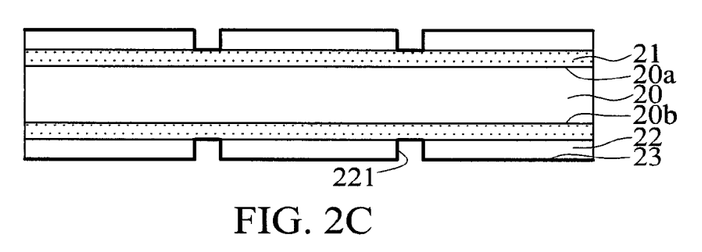
Figure 2D:
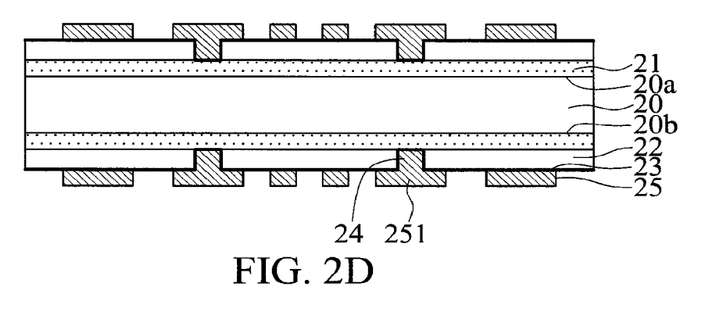
Figure 2E:
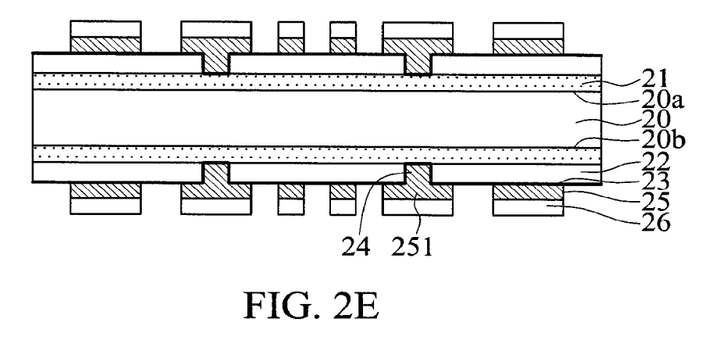
Figure 2F:
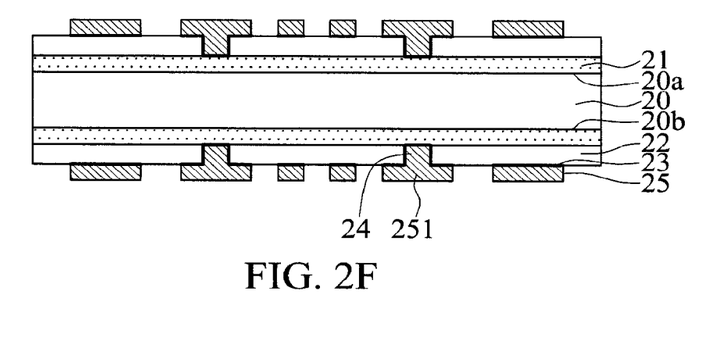
Figure 2G:
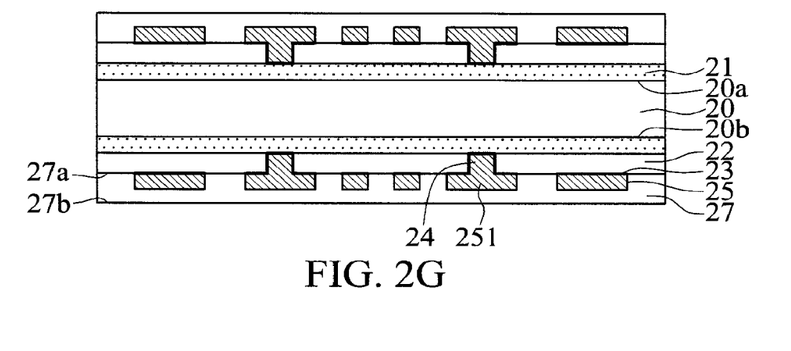
Figure 2H:
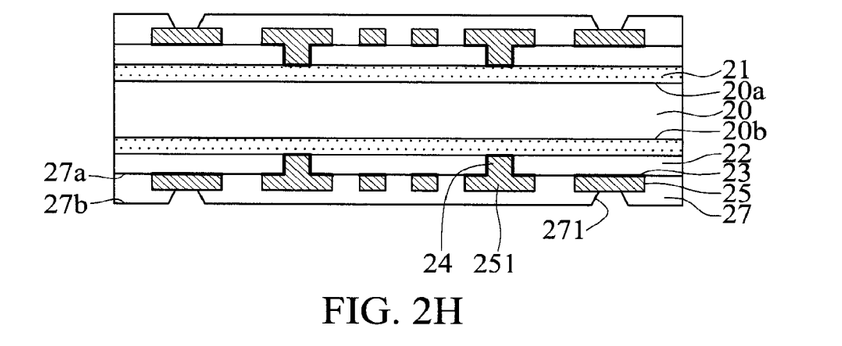
Figure 2I:
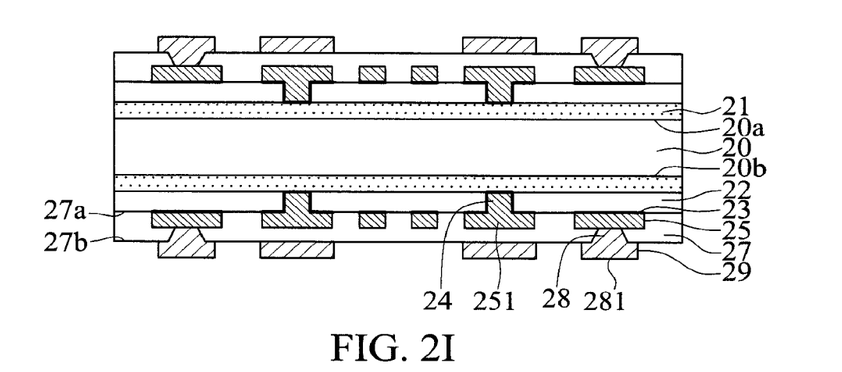
Figure 2J:
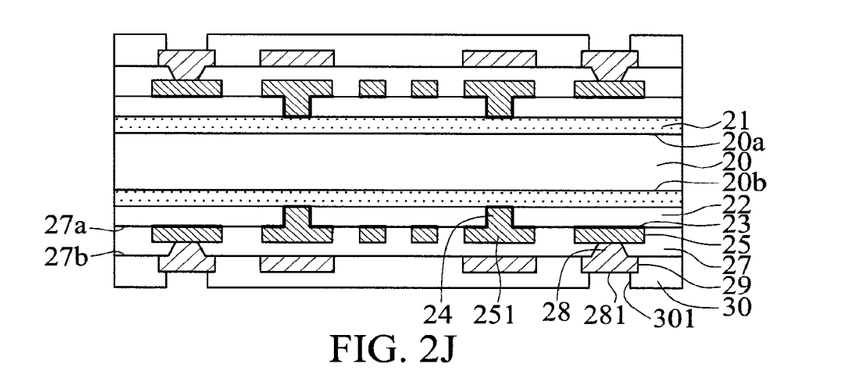
Figure 2K:
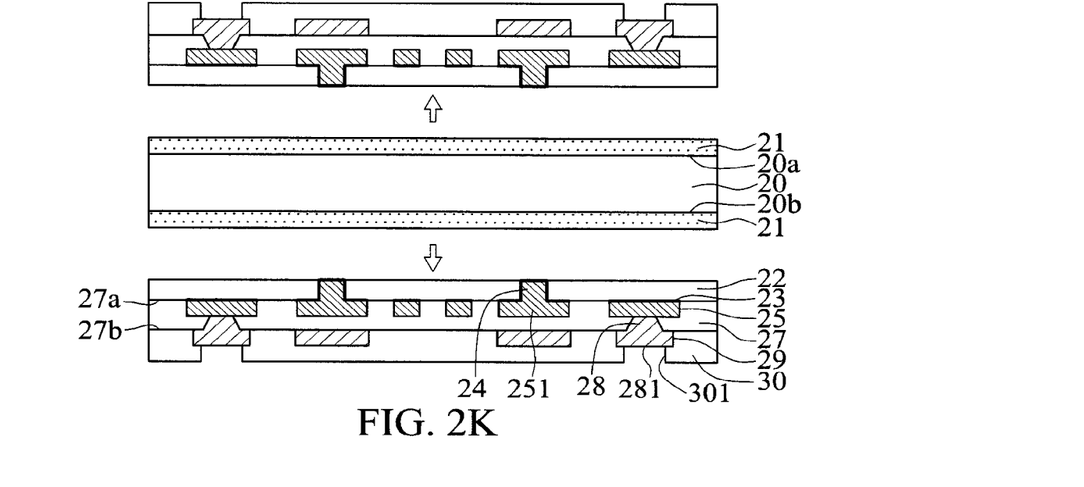
Figure 2L:
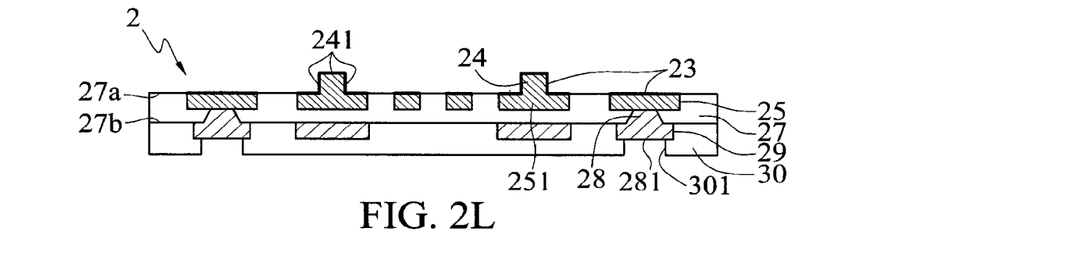
Figure 2M:
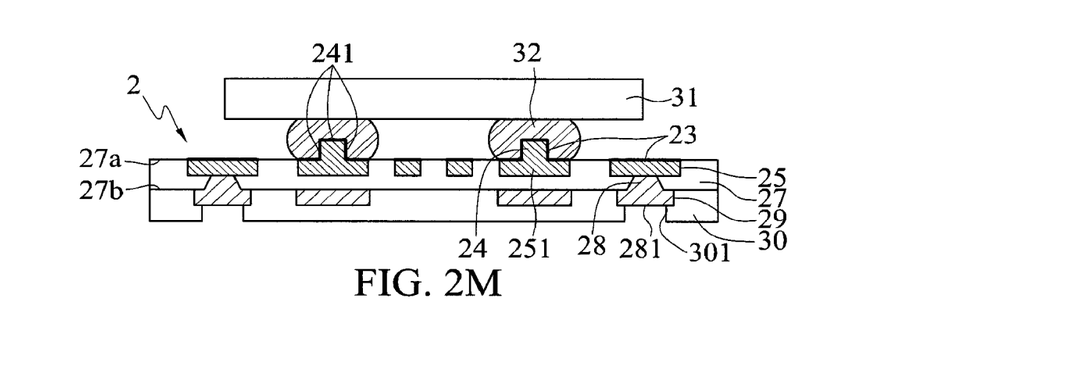
FIG. 2M is a schematic cross-sectional view of a semiconductor package having a semiconductor component disposed on the coreless packaging substrate of FIG. 2L through a plurality of conductive elements.

FIGS. 2A to 2L are schematic cross-sectional views showing a coreless packaging substrate 2 and a fabrication method thereof according to a first embodiment of the present invention, and FIG. 2M is a schematic cross-sectional view of a semiconductor package having a semiconductor component 31 disposed on the coreless packaging substrate 2 through a plurality of conductive elements 32.

Referring to FIG. 2A, a carrier 20 having opposite top and bottom surfaces 20a, 20b is provided, and a release layer 21 is formed on the top surface 20a and/or the bottom surface 20b of the carrier 20. The carrier 20 can be a stainless steel board.

Referring to FIG. 2B, a first resist layer 22 is formed on the release layer 21. The first resist layer 22 has a plurality of first openings 221 for exposing portions of the release layer 21.

Referring to FIG. 2C, by performing such as a sputtering process, a conductive layer 23 is formed on the first resist layer 22, walls of the first openings 221 and the portions of the release layer 21 exposed from the first openings 221. The conductive layer 23 can be a seed layer.

Referring to FIG. 2D, a plurality of protruding elements 24 are formed on the conductive layer 23 in the first openings 221 and a first circuit layer 25 is formed on the conductive layer 23. The first circuit layer 25 has a plurality of first conductive pads 251 formed on the protruding elements 24 and portions of the conductive layer 23 around peripheries of the protruding elements 24. Each of the protruding elements 24 can be a conductive post such as a copper post or a bonding pad. The width of the protruding element 24 is less than or equal to the width of the corresponding first conductive pad 251. The protruding element 24 and the first conductive pad 251 can be made of a same material or integrally formed.

Referring to FIG. 2E, a second resist layer 26 is formed on the first circuit layer 25 and the first conductive pads 251.

Referring to FIG. 2F, portions of the conductive layer 23 are removed according to the second resist layer 26 so as to expose portions of the first resist layer 22. Then, the second resist layer 26 is removed to expose the first circuit layer 25 and the first conductive pads 251.

Referring to FIG. 2G a dielectric layer 27 is formed on the first resist layer 22 so as to embed the first circuit layer 25 in the dielectric layer 27. The dielectric layer 27 has a first surface 27a bonded to the first resist layer 22 and a second surface 27b opposite to the first surface 27a.

Referring to FIG. 2H, by performing, for example, a laser drilling process, a plurality of second openings 271 are formed in the second surface 27b of the dielectric layer 27 to expose portions of the first circuit layer 25.

Referring to FIG. 2I, a conductive material is filled in the second openings 271 of the dielectric layer 27 to form a plurality of conductive vias 28 electrically connected to the first circuit layer 25. Further, a second circuit layer 29 is formed on the second surface 27b of the dielectric layer 27 and electrically connected to the conductive vias 28. The conductive vias 28 and the second circuit layer 29 can be formed at same or different times, made of same or different materials, and integrally or separately formed.

Referring to FIG. 2J, an insulating layer 30 is formed on the second circuit layer 29. The insulating layer 30 has a plurality of third openings 301 exposing the second conductive pads 281.

Referring to FIG. 2K, the release layer 21 is removed to remove the carrier 20 and expose the first resist layer 22.

Referring to FIG. 2L, the first resist layer 22 is removed to expose contact surfaces 241 of the protruding elements 24 and the conductive layer 23. As such, a coreless packaging substrate 2 is formed. The contact surfaces 241 of each of the protruding elements 24 include upper and side surfaces. The upper surface of the protruding element 24 protrudes above the first surface 27a of the dielectric layer 27. The conductive layer 23 on the first circuit layer 25 is flush with the first surface 27a of the dielectric layer 27.

Further, referring to FIG. 2M, a semiconductor component 31 such as a chip is disposed on the protruding elements 24 through a plurality of external conductive elements 32, such as bumps. The contact surfaces 241 of each of the protruding elements 24 or the conductive layer 23 on the contact surfaces 241 of each of the protruding elements 24 are encapsulated by the corresponding conductive element 32.

Figure 3A:
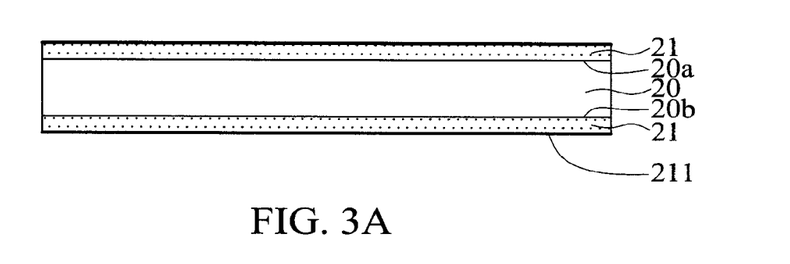
FIGS. 3A to 3L are schematic cross-sectional views showing a coreless packaging substrate and a fabrication method thereof according to a second embodiment of the present invention.
Figure 3B:
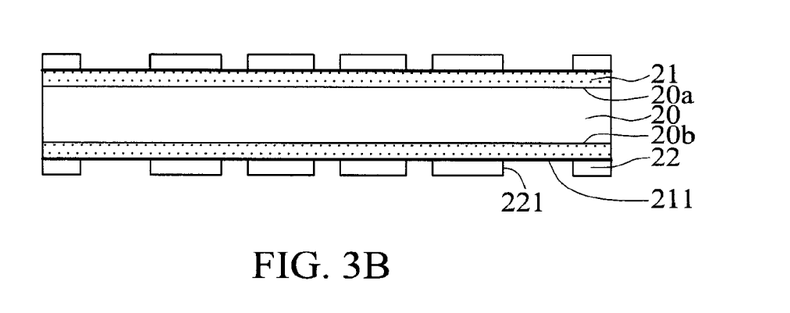
Figure 3C:
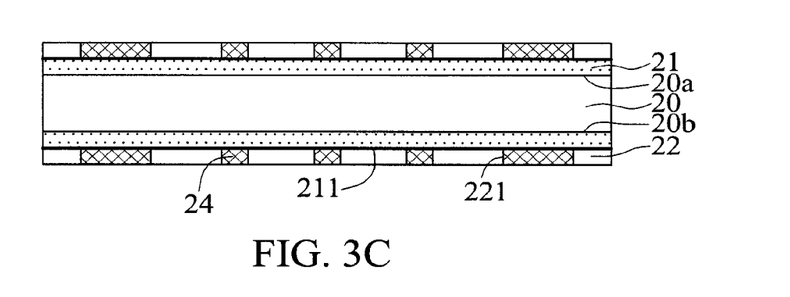
Figure 3D:
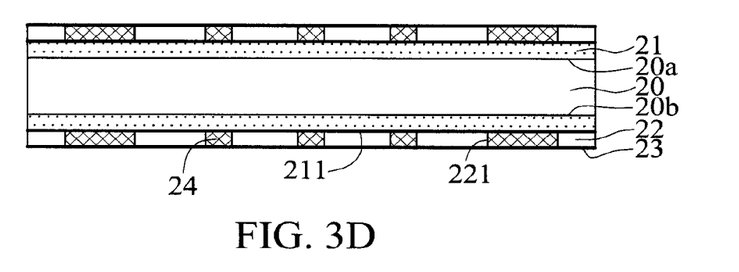
Figure 3E:
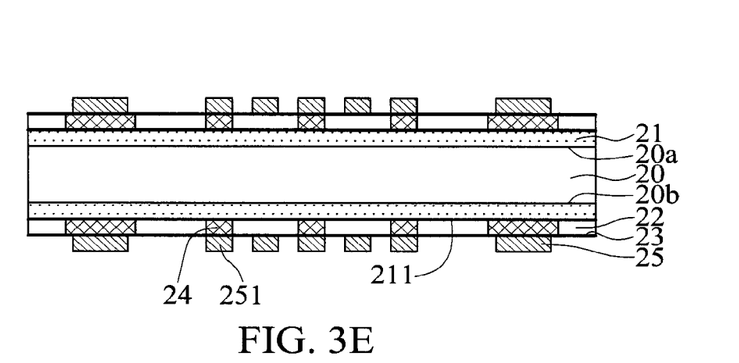
Figure 3F:
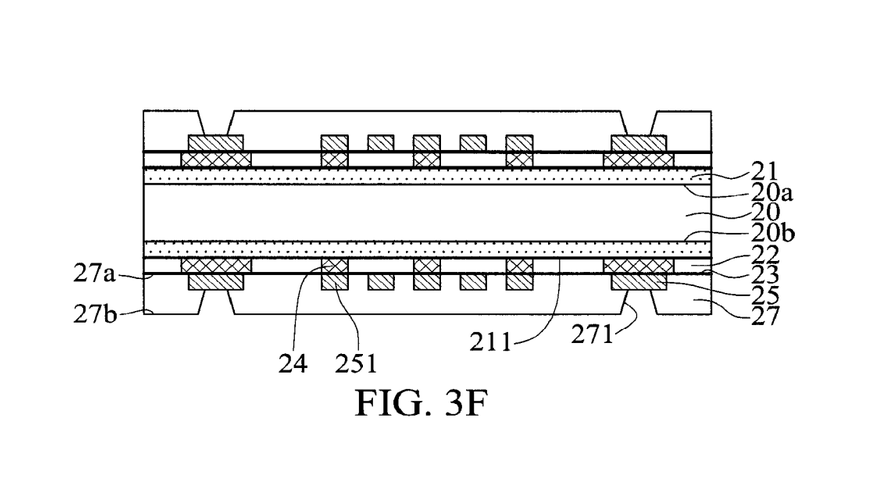
Figure 3G:
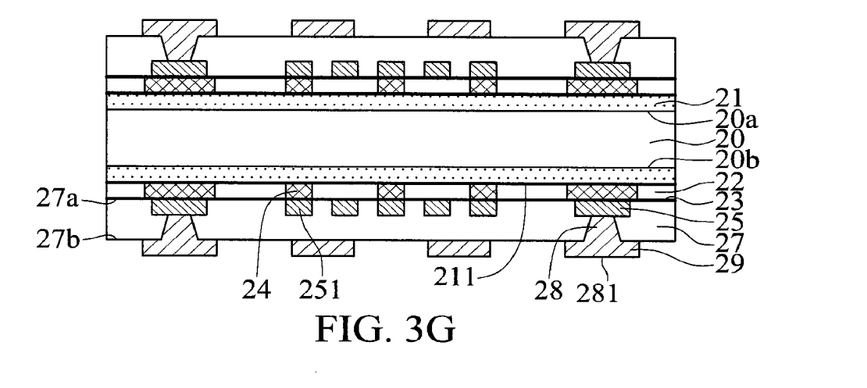
Figure 3H:
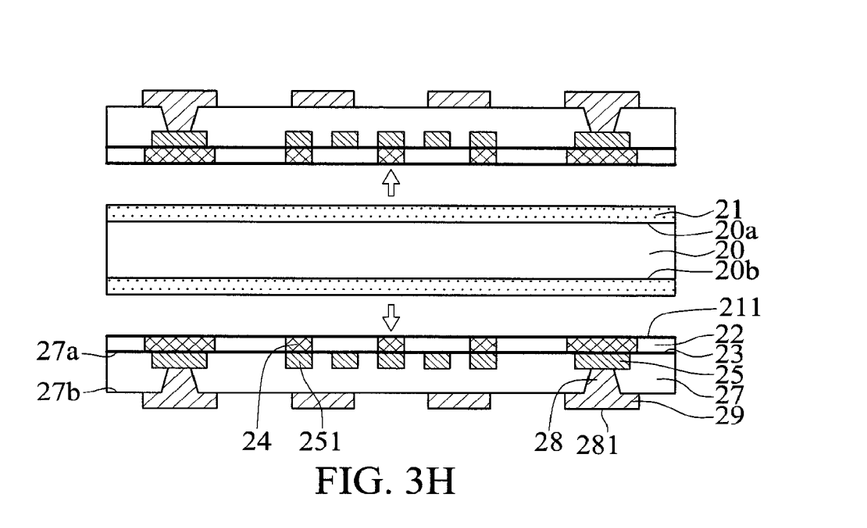
Figure 3I:
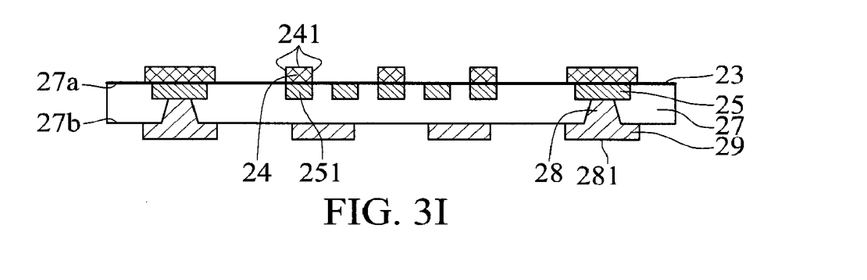
Figure 3J:
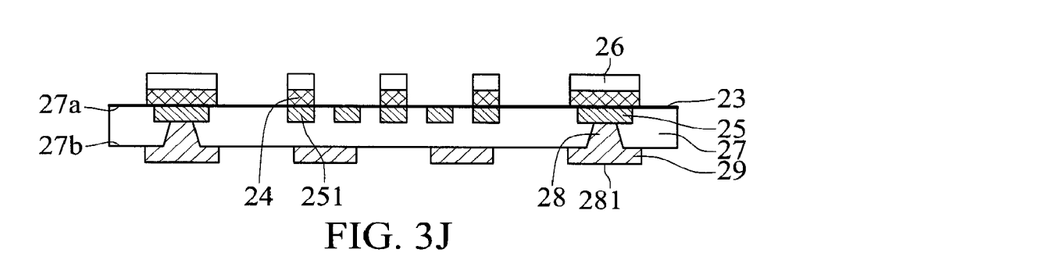
Figure 3K:
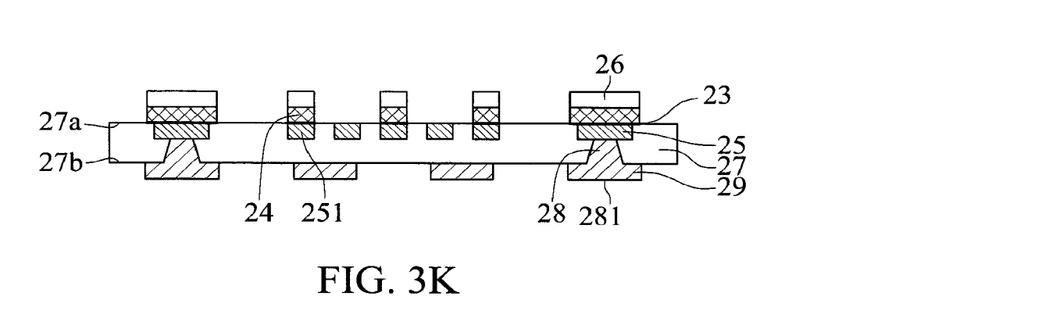
Figure 3L:
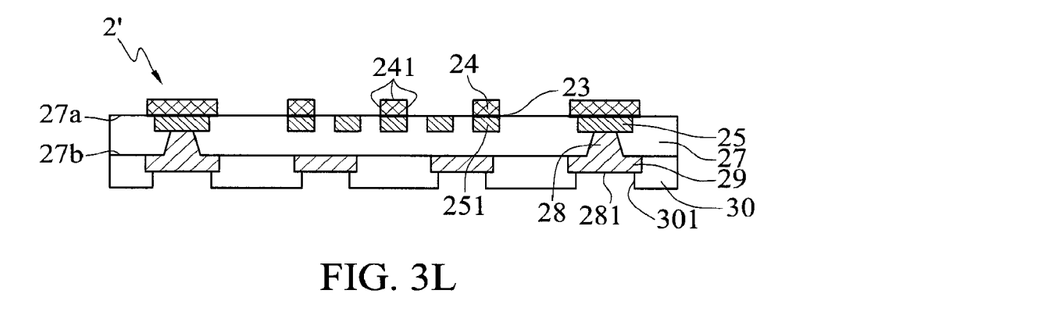
Figure 3M:
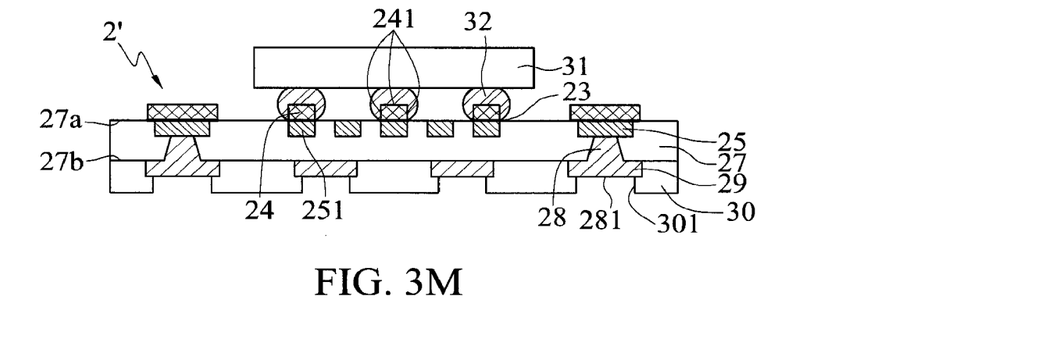
FIG. 3M is a schematic cross-sectional view of a semiconductor package having a semiconductor component disposed on the coreless packaging substrate of FIG. 3L through a plurality of conductive elements.

FIGS. 3A to 3L are schematic cross-sectional views showing a coreless packaging substrate 2' and a fabrication method thereof according to a second embodiment of the present invention, and FIG. 3M is a schematic cross-sectional view of a semiconductor package having a semiconductor component 31 disposed on the coreless packaging substrate 2' through a plurality of conductive elements 32.

Referring to FIG. 3A, a carrier 20 having opposite top and bottom surfaces 20a, 20b is provided, and a release layer 21 is formed on the top surface 20a and/or the bottom surface 20b of the carrier 20. A conductive layer 211 is formed on the release layer 21 by such as sputtering. The carrier 20 can be a stainless steel board, and the conductive layer 211 can be a seed layer.

Referring to FIG. 3B, a first resist layer 22 is formed on the conductive layer 21. The first resist layer 22 has a plurality of first openings 221 exposing portions of the conductive layer 211.

Referring to FIG. 3C, a plurality of protruding elements 24 are formed on the conductive layer 211 in the first openings 221. Each of the protruding elements 24 can be a conductive post such as a copper post or a bonding pad.

Referring to FIG. 3D, by performing such as a sputtering process, a conductive layer 23 is formed on the first resist layer 22 and the protruding elements 24. The conductive layer 23 can be a seed layer.

Referring to FIG. 3E, a first circuit layer 25 is formed on the conductive layer 23. The first circuit layer 25 has a plurality of first conductive pads 251 formed corresponding in position to the protruding elements 24. The width of each of the first conductive pads 251 is less than, equal to or greater than the width of the corresponding protruding element 24.

In another embodiment, the conductive layer 23 is omitted. The first circuit layer 25 is directly formed on the first resist layer 22, and the first conductive pads 251 are formed on the protruding elements 24.

Referring to FIG. 3F, a dielectric layer 27 is formed on the conductive layer 23 and the first circuit layer 25 so as to embed the first circuit layer 25 in the dielectric layer 27. The dielectric layer 27 has a first surface 27a in contact with the conductive layer 23 and a second surface 27b opposite to the first surface 27a. Then, by performing, for example, a laser drilling process, a plurality of second openings 271 are formed in the second surface 27b of the dielectric layer 27 so as to expose portions of the first circuit layer 25.

In another embodiment, the conductive layer 23 is omitted. The dielectric layer 27 is directly formed on the first resist layer 22, and the first conductive pads 251 are formed on the protruding elements 24.

Referring to FIG. 3G a conductive material is filled in the second openings 271 of the dielectric layer 27 to form a plurality of conductive vias 28 electrically connected to the first circuit layer 25. Further, a second circuit layer 29 is formed on the second surface 27b of the dielectric layer 27 and electrically connected to the conductive vias 28. The conductive vias 28 and the second circuit layer 29 can be formed at same or different times, made of same or different materials, and integrally or separately formed.

Referring to FIG. 3H, the release layer 21 is removed to remove the carrier 20 and expose the conductive layer 211.

Referring to FIG. 3I, the conductive layer 211 and the first resist layer 22 are removed to expose contact surfaces 241 of the protruding elements 24 and portions of the conductive layer 23.

Referring to FIG. 3J, a second resist layer 26 is formed on upper surfaces of the protruding elements 24.

Referring to FIG. 3K, portions of the conductive layer 23 are removed according to the second resist layer 26 so as to expose portions of the first surface 27a of the dielectric layer 27.

Referring to FIG. 3L, the second resist layer 26 is removed to expose the contact surfaces 241 of the protruding elements 24. As such, a coreless packaging substrate 2' is formed. The contact surfaces 241 of each of the protruding elements 24 include upper and side surfaces. The upper surface of the protruding element 24 protrudes above the first surface 27a of the dielectric layer 27. The first circuit layer 25 is flush with the first surface 27a of the dielectric layer 27.

Further, referring to FIG. 3M, a semiconductor component 31 such as a chip is disposed on the protruding elements 24 through a plurality of conductive elements 32, such as bumps. The contact surfaces 241 of each of the protruding elements 24 and the conductive layer 23 under the protruding element 24 are encapsulated by the corresponding conductive element 32.

Referring to FIGS. 2L and 2M, the present invention further provides a coreless packaging substrate 2, which has: a dielectric layer 27 having opposite first and second surfaces 27a, 27b; a first circuit layer 25 embedded in the dielectric layer 27 and exposed from the first surface 27a of the dielectric layer 27, wherein the first circuit layer 25 has a plurality of first conductive pads 251; a plurality of protruding elements 24 formed on the first conductive pads 251, respectively, wherein each of the protruding elements 24 has contact surfaces 241 to be encapsulated by an external conductive element 32; a second circuit layer 29 formed on the second surface 27b of the dielectric layer 27; and a plurality of conductive vias 28 formed in the dielectric layer 27 for electrically connecting the first circuit layer 25 and the second circuit layer 29.

The contact surfaces 241 of each of the protruding elements 24 can include upper and side surfaces of the protruding element 24. The width of the protruding element 24 can be less than or equal to the width of the corresponding first conductive pad 251. The protruding element 24 and the corresponding first conductive pad 251 can be made of a same material or integrally formed. The protruding element 24 can be a conductive post such as a copper post or a bonding pad, and the conductive element 32 can be a bump.

The second circuit layer 29 can have a plurality of second conductive pads 281 and the conductive vias 28 can be formed between the first circuit layer 25 and the second conductive pads 281.

The substrate 2 can further have a conductive layer 23 formed on the contact surfaces 241 of the protruding elements 24 and portions of the first conductive pads 251. The conductive layer 23 on the contact surfaces 241 of the protruding elements 24 are encapsulated by the conductive elements 32. Further, the conductive layer 23 on the first conductive pads 251 can be encapsulated by the conductive elements 32.

The substrate 2 can further have an insulating layer 30 formed on the second surface 27b of the dielectric layer 27 and the second circuit layer 29. The insulating layer 30 has a plurality of openings (for example, third openings 301) for exposing the second conductive pads 281 of the second circuit layer 29.

Referring to FIGS. 3L and 3M, the present invention further provides a coreless packaging substrate 2'. The coreless packaging substrate 2' differs from the coreless packaging substrate 2 in that the conductive layer 23 is formed between the protruding elements 24 and the first conductive pads 251. Referring to FIG. 3M, the contact surfaces 241 of each of the protruding elements 24 and the conductive layer 23 under the protruding element 24 are encapsulated by the corresponding conductive element 32.

According to the present invention, a plurality of protruding elements are formed on the first conductive pads. The protruding elements can be encapsulated by external conductive elements such as bumps and a semiconductor component such as a chip can further be disposed on the protruding elements through the conductive elements. Since a large contact area (for example, including upper and side surfaces of the protruding elements) is formed between the protruding elements and the conductive elements, the present invention strengthens the bonding between the first conductive pads and the conductive elements, thereby increasing the product reliability.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A method for fabricating a coreless packaging substrate, comprising the steps of:
   forming a first resist layer on a carrier, wherein the first resist layer has a plurality of first openings;
   forming a plurality of protruding elements in the first openings;
   forming a first circuit layer on the first resist layer, wherein the first circuit layer has a plurality of first conductive pads correspondingly formed on the protruding elements;
   forming a dielectric layer on the first resist layer so as to embed the first circuit layer in the dielectric layer, wherein the dielectric layer has a first surface bonded to the first resist layer and a second surface opposite to the first surface;
   forming a plurality of conductive vias in the dielectric layer and forming a second circuit layer on the second surface of the dielectric layer, wherein the first circuit layer and the second circuit layer are electrically connected through the conductive vias; and
   removing the carrier and the first resist layer so as to expose contact surfaces of the protruding elements.

2. The method of claim 1, wherein the dielectric layer has a plurality of second openings, and wherein the second openings are filled with a conductive material so as to form the conductive vias.

3. The method of claim 1, further comprising forming a release layer on top and/or bottom surfaces of the carrier so as to allow the first resist layer to be formed on the release layer and portions of the release layer to be exposed from the first openings of the first resist layer.

4. The method of claim 3, further comprising forming a conductive layer on the first resist layer, walls of the first openings and the portions of the release layer exposed from the first openings so as to allow the first circuit layer to be formed on the conductive layer and the protruding elements to be formed on the conductive layer in the first openings.

5. The method of claim 4, further comprising:
   forming a second resist layer on the first circuit layer and the first conductive pads;
   removing portions of the conductive layer according to the second resist layer so as to expose portions of the first resist layer; and
   removing the second resist layer to expose the first circuit layer and the first conductive pads.

6. The method of claim 5, further comprising:
   forming an insulating layer on the second circuit layer, wherein the insulating layer has a plurality of third openings exposing the second conductive pads; and
   removing the release layer so as to remove the carrier.

7. The method of claim 1, further comprising sequentially forming a release layer and a first conductive layer on top and/or bottom surfaces of the carrier so as to allow the first resist layer to be formed on the first conductive layer and portions of the first conductive layer to be exposed from the first openings of the first resist layer.

8. The method of claim 7, further comprising forming a second conductive layer on the first resist layer and the protruding elements so as to allow the first circuit layer and the first conductive pads to be formed on the second conductive layer.

9. The method of claim 8, further comprising:
   removing the release layer to remove the carrier;
   removing the first conductive layer and the first resist layer so as to expose the contact surfaces of the protruding elements;
   forming a second resist layer on the protruding elements;
   removing portions of the second conductive layer according to the second resist layer so as to expose portions of the dielectric layer; and
   removing the second resist layer to expose the contact surfaces of the protruding elements.

10. The method of claim 1, wherein the carrier is a stainless steel board.

* * * * *